United States Patent [19]

Geen

[11] Patent Number: 4,595,293
[45] Date of Patent: Jun. 17, 1986

[54] DETECTION OF MOVEMENT OF A CYCLIC INTERFERENCE WAVEFORM, SUCH AS IN A RING LASER GYROSCOPE

[75] Inventor: John A. Geen, Berkshire, England

[73] Assignee: British Aerospace Public Limited Company, London, England

[21] Appl. No.: 526,871

[22] Filed: Aug. 26, 1983

[30] Foreign Application Priority Data

Aug. 26, 1982 [GB] United Kingdom ............... 8224584

[51] Int. Cl.$^4$ .............................................. G01C 19/64
[52] U.S. Cl. .................................................. 356/350
[58] Field of Search .............................. 356/346, 350

[56] References Cited

U.S. PATENT DOCUMENTS

| | | | |
|---|---|---|---|
| 3,627,425 | 12/1971 | Doyle et al. | 356/350 |
| 3,721,497 | 3/1973 | Shutt et al. | 356/350 |
| 3,854,819 | 12/1974 | Andringa | 356/350 |
| 4,152,072 | 5/1979 | Hutchings | 356/350 |
| 4,219,276 | 8/1980 | Dorsman | 356/350 |
| 4,222,667 | 9/1980 | Layne | 356/346 |
| 4,432,646 | 2/1984 | Rodloff et al. | 356/350 |

FOREIGN PATENT DOCUMENTS 1578586  11/1980  United Kingdom ............... 356/346

Primary Examiner—Vincent P. McGraw
Assistant Examiner—S. A. Turner
Attorney, Agent, or Firm—Cushman, Darby & Cushman

[57] ABSTRACT

Detection means comprise at least three photodiodes 1, 2 and 3 which are spaced so as to expand to half a wavelength of an interference waveform produced in a ring laser gyroscope. The three photodiodes 1, 2 and 3 produce respective currents A, B and C the magnitudes of which are detected to sense the magnitude and direction of the movement of the interference waveform. The currents A, B and C are fed to a current mirror configured as a Norton amplifier input state 4, the latter producing signals which are fed to logic circuitry for obtaining signals representative of the rate and direction of the movement of the interference waveform.

6 Claims, 2 Drawing Figures

DETECTION OF MOVEMENT OF A CYCLIC INTERFERENCE WAVEFORM, SUCH AS IN A RING LASER GYROSCOPE

This invention relates to detection means for detecting the movement of a cyclic interference waveform, such as the fringe or interference waveform resulting from the combination of two counter-rotating beams in a ring laser gyroscope.

When the two counter-rotating beams in a ring laser gyroscope are combined, they form an interference or fringe pattern. As the phase difference between the two contra-rotating beams changes (due to rotation of the laser gyroscope about its sensitive axis), the fringe waveform moves in space. The magnitude of this movement is proportional to the phase difference between the two contra-rotating beams, and the direction of the movement is indicative of the sense of the phase difference. Therefore, detection of the magnitude and sense of the movement of the fringe waveform enables the rate of rotation, and its direction, to be determined.

Hitherto, detection of the movement of the fringe waveform has been carried out by employing two photo-sensitive devices (such as photodiodes) exposed to the illumination of a portion of the waveform. The signals from these two devices are passed through a capacitor to remove the d.c. component, the resulting sinusoidal waveform being passed through a zero crossing detector. The output of the zero crossing detector, together with the two output signals from the photo-sensitive devices, provide three pieces of information from which the magnitude and sense of the movement of the fringe waveform can be determined.

At low turning rates of the laser gyroscope, difficulties arise in obtaining an accurate output from the zero crossing detector because instability of the d.c. component makes it difficult to maintain the correct reference level for zero crossing of the low frequency sinusoidal waveform in the zero crossing detector. The invention aims to reduce this difficulty by providing an alternative way of detecting movement of a cyclic interference waveform.

According to the invention detection means for detecting the movement of a cyclic interference waveform comprises at least three photo-sensitive devices which are arranged so as to be exposed to different parts of the interference waveform which moves relative to the photo-sensitive devices, the photo-sensitive devices being linked to form at least two pairs, and signal processing means for making a comparison of the output signals of the two photo-sensitive devices of each pair and for providing from these comparisons a measure of the amplitude of the movement of the interference waveform and an indication of the direction of said movement. By sensing the outputs of two pairs of photo-sensitive devices, the local slope of the cyclic interference waveform can be detected, eliminating the d.c. component which is unstable. Not only is this technique more accurate, but it dispenses with the zero crossing detector and related electronics which synthesize the third piece of information in prior arrangements.

Preferably, the photo-sensitive devices are spaced apart so as to be exposed in combination to no more than one half of a cycle of the interference waveform. The comparison signals may be fed to logic circuitry for producing signals representative of the measure of the amplitude of the movement of the interference waveform and an indication of the direction of this movement.

The comparison means may be differential current means which in turn may utilise a current mirror which may form part of a Norton amplifier. The use of a Norton amplifier saves a great deal of electronic circuitry as compared with prior arrangements utilising two photodiodes only, and this saving more than compensates for the extra photodiode (or photodiodes) required in the inventive detection means.

Detection means according to the invention, and for detecting the movement of a cyclic interference waveform generated on a ring laser gyroscope, will now be described in greater detail with reference to the accompanying drawings, in which.

Figures 1, 2:
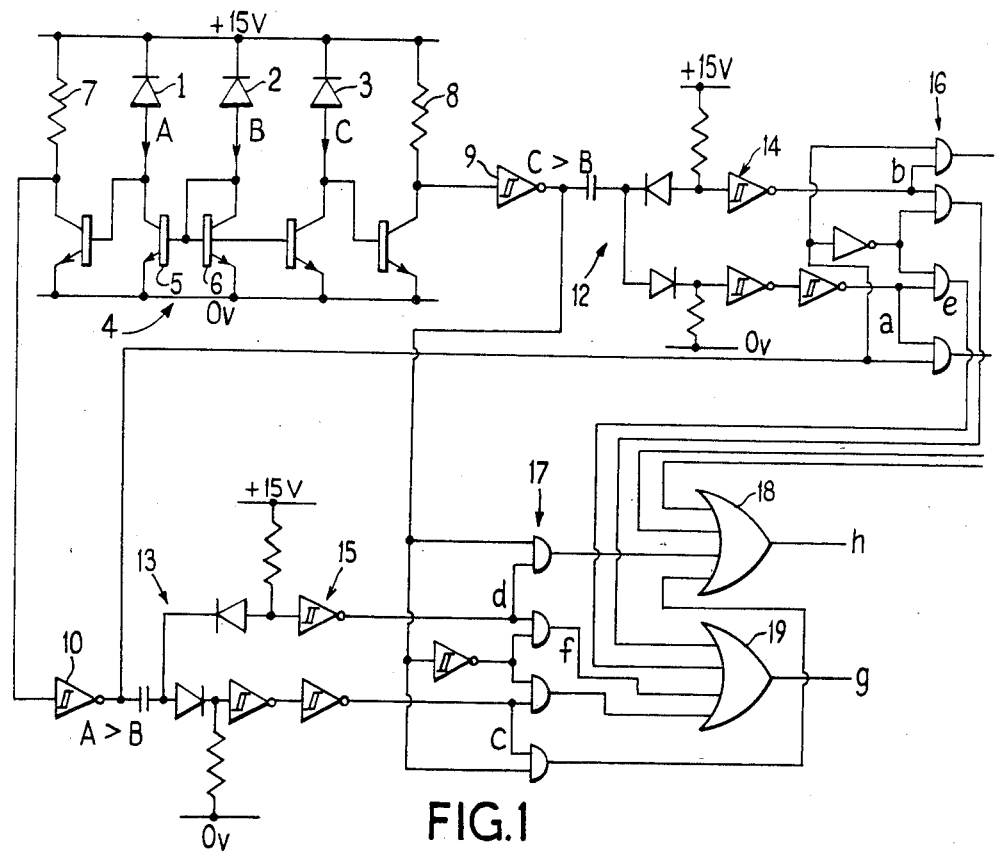
FIG. 1 is a circuit diagram of the detection means.
FIG. 2 is a table used in explaining the operation of the detection means.

The interference pattern generated by the ring laser gyroscope is a sinusoidal waveform which, as previously explained, moves in dependence upon the rotation sensed by the gyroscope. The detection means comprise three photodiodes 1, 2 and 3 which are spaced apart so as to be exposed to and be scanned by one half of a wavelength of the sinusoidal waveform. This forms a window across which the sinusoidal waveform moves when the gyroscope is rotated about its sensitive axis. The electrical output currents A, B and C from the three respective photodiades 1, 2 and 3 are sensed to determine the magnitude of the movement of the sinusoidal waveform and its direction.

The three photodiodes 1, 2 and 3 are linked to form two pairs 1, 2 and 2, 3, the remaining circuitry of FIG. 1 forming signal processing means for comparing the output currents of the two photodiodes of each pair and deriving from this comparison the required information, namely the magnitude and sense of the movement of the sinusoidal waveform.

The two photodiodes, 1 and 2 are connected to a current mirror configured as a Norton amplifier input stage 4. The Norton amplifier input stage 4 includes two transistors 5 and 6 which are matched and preferably diffused on the same substrate. The two photodiodes 2 and 3 are connected to a similar current mirror, sharing the transistor 6. The Norton amplifier input stages are connected to two Schmitt trigger circuits 9 and 10; the first trigger circuit 9 produces a logic high signal if the current C is greater than the current B, and a logic low signal if the current C is less than the current B; the second trigger circuit 10 produces a logic high signal if the current A is greater than the current B, and a logic low signal if the current A is less than the current B.

The logic signals from the trigger circuits 9 and 10 are fed to logic circuitry employing respective capacitor/diode circuits 12 and 13, Schmitt trigger circuits 14 and 15, AND gates 16 and 17 and OR gates 18 and 19. Each output pulse g from the OR gate 19 represents movement of the sinusoidal waveform by a quarter wavelength in a first or positive direction, and each output pulse h from the OR gate 18 represents movement of the sinusoidal waveform by a quarter wavelength on a second or negative direction. Hence the pulse repetition frequencies of the pulses g and h are indicative of the rate of the movement of the fringe waveform, and its direction.

This is explained more fully below with reference to FIG. 2 which is in the form of a table showing in the right-hand column the various intensity profiles, i.e. the various shapes of the half wave appearing in the window viewed by the three photodiodes 1, 2 and 3. The middle column shows the corresponding relationships of the output currents A, B and C from the three photodiodes, 1, 2 and 3, and the left-hand column defines the various states as X, Y, Z and W.

In FIG. 1:

a indicates pulses corresponding to the transition C<B to C>B b indicates pulses corresponding to the transition C>B to C<B c indicates pulses corresponding to the transition A<B to A>B d indicates pulses corresponding to the transition A>B to A<B It can be seen that:

State X changing to state Z, or

State W changing to state X, or

State Y changing to state W, or

State Z changing to state Y indicates movement of the intensity profile (i.e. of the sinusoidal waveform) by a quarter of a wavelength, $\lambda/4$, in a positive direction. Also, State Z changing to state X, or State X changing to state W, or State W changing to state Y, or State Y changing to state Z indicates movement of the intensity profile (i.e. of the sinusoidal waveform) by a quarter of a wavelength, $\lambda/4$, in a negative direction.

The transition X changing to Z corresponds to the condition a$\Lambda$ (A<B), i.e. a$\Lambda$ $\overline{(A>B)}$ which in turn corresponds to the signal e in FIG. 1.

Also, W changing to X corresponds to d$\Lambda$ $\overline{(C>B)}$ which in turn corresponds to signal f in FIG. 1. The other changes of state are similarly decoded. Thus, pulses g and h respectively represent movement of the sinusoidal waveform by a quarter wavelength in the positive and negative directions, respectively.

The particular advantages of the described embodiment are that:

(i) the signal processing circuitry lends itself to integration in the same package as the photodiodes, the circuitry being simple, requiring few passive components and requiring little power.

(ii) there is very little change in voltage across the photodiodes during the change between output states. This is important if the self capacitance of the photodiodes is not to limit severely the response speed of the system. Thus, the detection means allow for operation of the laser gyroscope at high rates of turn without elaborate circuitry for maintaining bandwidth of the photodiodes.

Whilst the described embodiment utilises three photodiodes, the number of photodiodes may exceed three in number. If an array of N pairs of photodiodes are distributed over a half wavelength of the interference waveform there exists at any one time only one extremal of the intensity pattern on the array. Then, any change in the logic condition of the pairs correspond to a shift of the extremal resolved to 1/2N of a wavelength.

That is, the resolution becomes the wavelength divided by the number of diodes in the linear array. The limit to the number of diodes which may be employed is determined largely by the mismatch between adjacent diodes in the array and the offsets of the comparator, i.e. the mismatch between the transistors in the current mirror. When the resolution becomes so high that the intensity variation for pairs just to either side of an extremal is comparable to the mismatch the position of the peak becomes ambiguous.

A differential voltage amplifier may be used instead of a current mirror. Also, the logic circuitry of FIG. 1 may use OR and NOR gates by the application of De Morgan's theorem. The logic circuitry of FIG. 1 preferably uses metal oxide semiconductor chips.

I claim:

1. A ring laser gyroscope of which the rotation indicative output signal forming means includes:

radiation receiving means connected to the gyroscope for receiving and combining respective portions of the counter-rotating components of the gyroscope laser beam to form an interference fringe pattern which moves relative to the gyroscope in dependence upon rotation of the gyroscope about its sensitive axis;

a plurality of photo-sensors supported by the gyroscope at positions defining the extremities of a series of portions of a half-wavelength of the fringe intensity waveform, the photo-sensors being operable to produce output currents indicative of the fringe intensities at respective ones of the extremity positions;

current comparator means comprising a plurality of transistors having collector terminals connected to respective ones of the photo-sensors to receive the output currents therefrom, one of the two transistors which are connected to photo-sensors at the extremities of each said waveform portion having its base terminal connected to its collector terminal and to the base terminal of the other of the said two transistors for forming at the collector terminal of said other transistor a slope signal indicative of the relationship between the photo-sensor output currents received by the said two transistors and hence indicative of the slope of the associated waveform portion;

polarity transition sensing means connected to said comparator means for forming polarity transition signals indicative of polarity transitions of the slope signals; and logic means connected to the comparator means and the polarity transition sensing means and operable for using the slope signals and the polarity transition signals to derive output signals indicative of the amount and direction of movement of the fringe pattern.

2. A gyroscope according to claim 1, wherein there are three of said photo-sensors and they are supported at positions defining the extremities of two contiguous wave-form portions, said comparator means comprising three transistors having collector terminals connected to respective ones of the photo-sensors, and the transistor which is connected to the central one of the photo-sensors having a base terminal connected to its said collector terminal and to a base terminal of each other transistor.

3. A gyroscope according to claim 1, wherein said comparator means comprises, for each said other transistor, a respective slope signal amplifying transistor having a base terminal connected to the said collector terminal of the associated other transistor, having a collector terminal connected to one of two drive voltage supply rails via a respective collector resistor, and having an emitter terminal connected to the other of said two drive voltage supply rails.

4. A gyroscope according to claim 1, wherein said polarity transition sensing means comprises a plurality of capacitors each having one side connected to the comparator means to receive a respective one of the slope signals, a plurality of pairs of diodes, one diode of each pair having its anode connected to the other side of a respective one of the capacitors and the other diode of the pair having its cathode connected to the other side of that capacitor, and pulse shaping means connected to the diodes to form, for each slope signal, two output pulse trains one of which comprises pulses indicative of respective negative-going polarity transitions of the associated slope signal while the other of which comprises pulses indicative of respective positive-going polarity transitions of that slope signal.

5. A gyroscope according to claim 4, wherein said logic means comprises, for each said pulse train, a first and a second AND gate each connected to the polarity-transition sensing means to receive the associated pulse train and further connected to the comparator means to be controlled, in dependence upon the slope signal indicative of the slope of a waveform portion next adjacent to that which is associated with the pulse train, to pass the pulse train alternatively to the output of the first or the second AND gates, the logic means further comprising first OR gating means having a plurality of inputs connected to the outputs of respective ones of the first AND gates, and second OR gating means having a plurality of inputs connected to the outputs or respective ones of the second AND gates.

6. A gyroscope according to claim 1, wherein there are at least four photo-sensors supported at positions defining the extremities of at least two waveform portions.

* * * * *